(12) United States Patent
Gorecki et al.

(10) Patent No.: US 8,031,783 B1
(45) Date of Patent: Oct. 4, 2011

(54) PHASE NOISE SHAPING USING SIGMA DELTA MODULATION IN A TIMING RECOVERY UNIT

(75) Inventors: James L. Gorecki, Hillsboro, OR (US); Tong Liu, Aloha, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/754,511

(22) Filed: Apr. 5, 2010

Related U.S. Application Data

(62) Division of application No. 11/639,656, filed on Dec. 14, 2006, now Pat. No. 7,720,160.

(51) Int. Cl.
*H04B 14/06* (2006.01)
*H04L 7/00* (2006.01)
*H03M 1/20* (2006.01)

(52) U.S. Cl. .......................... 375/247; 375/355; 341/143

(58) Field of Classification Search .................. 375/244, 375/245, 247, 371, 373, 376, E7.247; 341/126, 341/143, 144, 76, 77
See application file for complete search history.

(56) References Cited

U.S. PATENT DOCUMENTS

| | | | |
|---|---|---|---|
| 5,745,061 A * | 4/1998 | Norsworthy et al. ......... | 341/131 |
| 6,256,395 B1 | 7/2001 | Melanson | |
| 6,707,855 B2 | 3/2004 | Patana | |
| 6,920,182 B2 * | 7/2005 | Bolton, Jr. ..................... | 375/247 |
| 7,181,180 B1 * | 2/2007 | Teo et al. ....................... | 455/260 |
| 7,443,324 B1 * | 10/2008 | Muhammad ................... | 341/131 |
| 7,554,474 B2 | 6/2009 | Le Guillou | |
| 2001/0033200 A1 * | 10/2001 | Staszewski et al. ............. | 331/18 |
| 2002/0008588 A1 | 1/2002 | Khan | |
| 2003/0174799 A1 * | 9/2003 | Fahim ........................... | 375/376 |
| 2005/0141638 A1 * | 6/2005 | Haiut ............................ | 375/296 |
| 2007/0040718 A1 * | 2/2007 | Lee ................................ | 341/143 |
| 2008/0175333 A1 * | 7/2008 | Jensen et al. .................. | 375/268 |
| 2010/0103013 A1 * | 4/2010 | Deval et al. ................... | 341/143 |

FOREIGN PATENT DOCUMENTS

| | | |
|---|---|---|
| EP | 0782063 A1 | 2/1997 |
| WO | WO 9949578 * | 9/1999 |

* cited by examiner

*Primary Examiner* — Tesfaldet Bocure
(74) *Attorney, Agent, or Firm* — Haverstock & Owens LLP

(57) ABSTRACT

A method and apparatus for converting a high precision digital word into a high precision analog value is disclosed. A sigma delta modulator applies a digital input signal to a dither signal to generate a combined signal for sampling. A digital-to-analog converter quantizes the combined signal. An analog filter provides a cutoff at a bandwidth of interest to remove out of band quantization noise and signals. An I transfer function and a Q transfer function can be coupled between the sigma delta modulator and the digital-to-analog converter for mapping of the combined signal. The apparatus can also include a phase interpolator for receiving the output signal and outputting a clock recovery phase.

44 Claims, 3 Drawing Sheets

PHASE NOISE SHAPING USING SIGMA DELTA MODULATION IN A TIMING RECOVERY UNIT

CROSS-REFERENCE TO RELATED APPLICATIONS

This Patent Application is a divisional application of U.S. patent application Ser. No. 11/639,656, filed on Dec. 14, 2006, and entitled "PHASE NOISE SHAPING USING SIGMA DELTA MODULATION IN A TIMING RECOVERY UNIT", now issued as U.S. Pat. No. 7,720,160 on May 18, 2010. The application Ser. No. 11/639,656, filed on Dec. 14, 2006, and entitled "PHASE NOISE SHAPING USING SIGMA DELTA MODULATION IN A TIMING RECOVERY UNIT", now issued as U.S. Pat. No. 7,720,160 on May 18, 2010, is hereby incorporated by reference.

FIELD OF THE INVENTION

This invention relates generally to phase-locked loops (PLL's) in timing recovery. More specifically, this invention relates to PLL's using sigma delta modulation in timing recovery to convert a high precision digital word into a high precision analog value.

BACKGROUND OF THE INVENTION

Timing recovery units perform clock recovery and data retiming functions. Well known timing recovery schemes include a phase-locked loop (PLL). The PLL is basically a closed loop frequency control system, which operates by producing an oscillator frequency to match the frequency of an input signal. In this locked condition, any slight change in the frequency of the input signal first appears as a change in phase between the input signal frequency and the oscillator frequency. This phase shift then acts as an error signal to change the frequency of a local PLL oscillator to match the input signal frequency. The locking onto a phase relationship between the input signal frequency and the local oscillator accounts for the name phase-locked loop.

FIG. 1A illustrates a prior art timing recovery unit 10 as part of a high-speed transceiver, which provides receiver clocks that are synchronized to an incoming signal. The timing recovery unit 10 comprises a clock multiplying unit 15 including a voltage-controlled oscillator (VCO) 20, and a PLL loop 25 comprising a phase detector 30, a loop filter 40 and a phase interpolator 50. The clock multiplying unit 15 takes a reference clock and speeds it up to a high frequency. The VCO 20 is thus locked to the reference clock. A phase interpolator 50 takes the phase from the VCO 20 and shifts the phase either forward or backward to track frequency as well as phase from a received (Rcvd) signal. An output clock of the phase interpolator 50 drives a phase detector 30 which compares the output clock to the received signal and generates output current pulses proportioned to the phase error between them. The output current pulses are filtered and integrated by a loop filter 40 to generate a voltage.

FIG. 1B illustrates a prior art implementation of the timing recovery unit of FIG. 1A. A quadrature low frequency analog oscillator 60 is provided to control a phase interpolator 70. The oscillator 60, which receives an input voltage, can operate from a positive frequency to a negative frequency. Phase interpolation is then performed to output a high speed recovery clock aligned with an incoming high speed signal. A benefit of this implementation is that the control elements are low frequency devices, and both the control oscillator 60 and the phase interpolator 70 are designed in analog form. A problem with this implementation, however, is that when the phase is "locked", the control oscillator 60 has to maintain that phase perfectly in perpetuity. Due to variations in manufacturing and introduction over many units, mismatches and imperfections degrade performance. The control oscillator 60 can cause phase errors induced by supply or substrate noise that can accumulate over many clock cycles. At higher frequencies, overload and saturation of the control oscillator 60 can affect the stability of the system. Leakage, drifts in frequencies, and other sensitivities caused by analog devices in prior art PLL's degrade performance and bit error rate (BER) targets.

What is needed is a PLL-based timing recovery unit that avoids sensitive analog circuitry, increases yield, and provides digital programmability in the system and preferably on the same integrated circuit chip. What is also needed is a timing recovery unit using both analog and digital devices to modulate phase and achieve sub-picosecond phase resolution in a timing recovery unit. What is also needed is a timing recovery unit that uses both analog and digital techniques on a single integrated circuit to convert a high precision digital word into a high precision analog value while preventing an overload or saturation condition.

BRIEF SUMMARY OF THE INVENTION

The present invention is directed to a method of and apparatus for converting a high precision digital word representing the desired phase into a high precision analog value representing the desired phase using low precision components. This invention uses digital circuits to achieve deep sub-picosecond timing resolution using imprecise analog circuits. Additionally, the majority of the digital circuits can be synthesized, thereby reducing design time. This invention avoids sensitive analog circuitry, increases yield, recovers granularity and preserves precision through control of a phase interpolator which controls adjustment of the clock phase. The invention achieves higher precision for greater phase lock loop (PLL) accuracy.

In accordance with an embodiment of the present invention, a method of converting a high precision digital word into a high precision analog value is disclosed. The method comprises the steps of applying a digital input signal to a dither signal to generate a combined signal for sampling; quantizing the combined signal; and filtering the combined signal to generate an output signal. The method can also include the step of sampling the combined signal. The method can further include the step of oversampling the combined signal.

In accordance with the present invention, a DC value of the dither signal is shifted before the dither signal is applied to the digital input signal. Preferably, the output signal is an interpolated value of the digital input signal. The digital signal can be generated by a phase accumulator. The dither signal, which can be a frequency shaped noise signal, is preferably generated by a sigma delta modulator. The combined signal can be mapped into an I transfer function and a Q transfer function.

In accordance with the present invention, the output signal is preferably an analog value. The combined signal is preferably filtered by an analog reconstruction filter to filter out shaped phase noise. The filtered signal can be inputted to a phase interpolator. An output of the phase interpolator is fed back to a phase detector.

In accordance with an alternative embodiment of the present invention, an apparatus for converting a high precision digital word into a high precision analog value is disclosed. The apparatus comprises a sigma delta modulator for applying a digital input signal to a dither signal to generate a combined signal for sampling; a digital-to-analog converter for converting the combined signal; and an analog filter for filtering the combined signal to generate an output signal. The analog filter provides a cutoff at a bandwidth of interest which removes out of band quantization noise and signals. The apparatus can also include an I transfer function and a Q transfer function coupled between the sigma delta modulator and the digital-to-analog converter. The combined signal is preferably mapped into the I and Q transfer functions. The apparatus can further include a phase interpolator for receiving the output signal and outputting a clock recovery phase.

In accordance with another embodiment of the present invention, a sigma delta modulator is disclosed. The sigma delta modulator comprises a twos-complement accumulator for generating a phase accumulator output; a subtractor for subtracting a quantization feedback signal for the phase accumulator output to generate a first subtracted signal; and a two-input multiplexer for combining the first subtracted signal and a modulator output feedback signal to generate a first combined signal.

Preferably, the modulator allows a wrap procedure of the phase accumulator output to be perform. The sigma delta modulator can also include a plurality of outputs and generate an I transfer function and a Q transfer function. The modulator can be at least one of a first order sigma delta modulator, a second order sigma delta modulator, and a n-order sigma delta modulator.

In accordance with another embodiment of the present invention, a sigma delta modulator is disclosed. The sigma delta modulator comprises a twos-complement accumulator for generating a phase accumulator output; a subtractor for subtracting a quantization feedback signal for the phase accumulator output to generate a first subtracted signal; a two-input multiplexer for combining the first subtracted signal and a modulator output feedback signal to generate a first combined signal; and means for performing a wrap procedure of the phase accumulator output.

In accordance with another embodiment of the present invention, a method of modulating phase in a timing recovery unit is disclosed. The method comprises the steps of generating a phase accumulator output; subtracting a quantization feedback signal from the phase accumulator output to produce a first subtracted signal; and combining the first subtracted signal and a modulator output feedback signal to generate a first combined signal.

In accordance with another embodiment of the present invention, a method of modulating phase in a timing recovery unit is disclosed. The method comprises the steps of generating a phase accumulator output; subtracting a quantization feedback signal from the phase accumulator output to produce a first subtracted signal; combining the first subtracted signal and a modulator output feedback signal to generate a first combined signal; and performing a wrap procedure of the phase accumulator output.

In accordance with another embodiment of the present invention, a timing recovery unit using sigma delta modulation is disclosed. The timing recovery unit comprises a sigma delta modulator for applying a digital input signal to a dither signal to generate a combined signal for sampling; an I transfer function and a Q transfer function coupled to the modulator for defining the phase interval for interpolation; a digital-to-analog converter for quantizing the combined signal; and an analog filter for filtering the combined signal to generate an output signal. The timing recovery unit can also include a phase interpolator for receiving the output signal and outputting a clock recovery phase, wherein an output of the phase interpolator is fed back to a phase detector.

DETAILED DESCRIPTION OF THE INVENTION

Reference will now be made in detail to the preferred and alternative embodiments of the invention, examples of which are illustrated in the accompanying drawings. While the invention will be described in conjunction with the specific embodiments, it will be understood that the invention is not limited to these embodiments. On the contrary, the invention covers alternatives, modifications and equivalents, which are included within the spirit and scope of the invention as defined by the appended claims as read in light of this specification. Furthermore, in the following detailed description of the present invention, numerous specific details are set forth to provide a thorough understanding of the present invention. However, it should be noted that the present invention may be practiced without these specific details. In other instances, well known methods, procedures and components have not been described in detail as not to unnecessarily obscure aspects of the present invention.

Figure 1A:
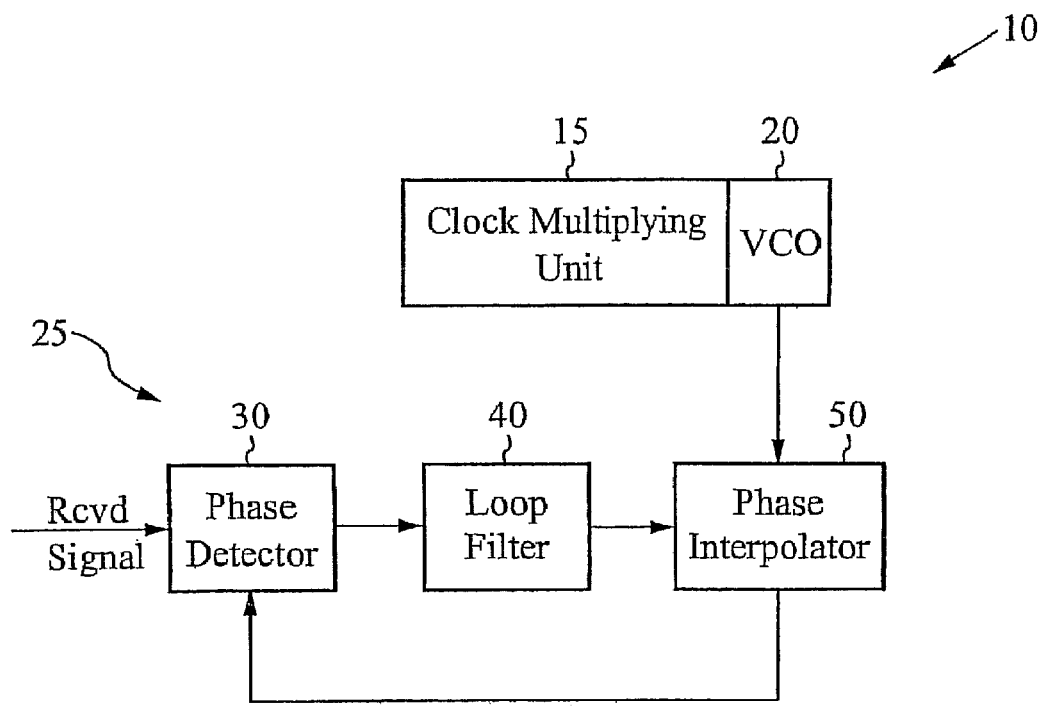
FIG. 1A illustrates a prior art timing recovery unit as part of a high-speed transceiver.
Figure 1B:
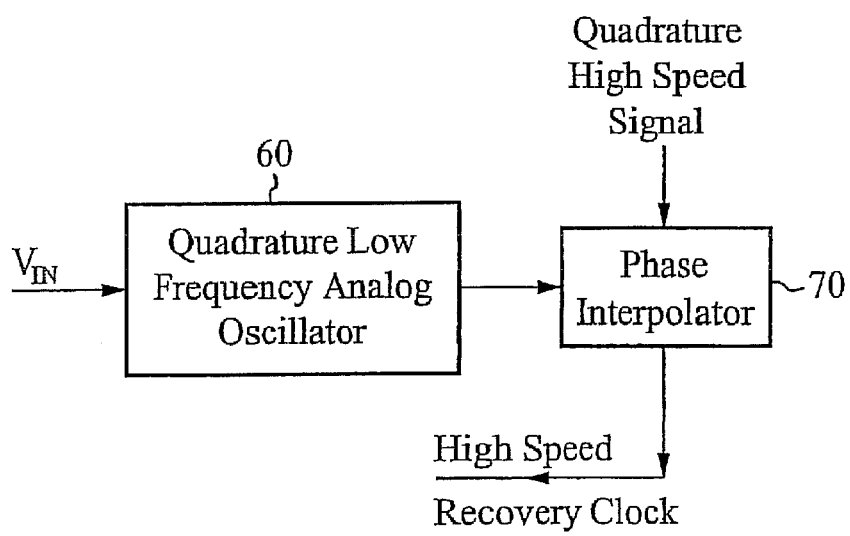
FIG. 1B illustrates a prior art implementation of the timing recovery unit of FIG. 1A.
Figure 2:
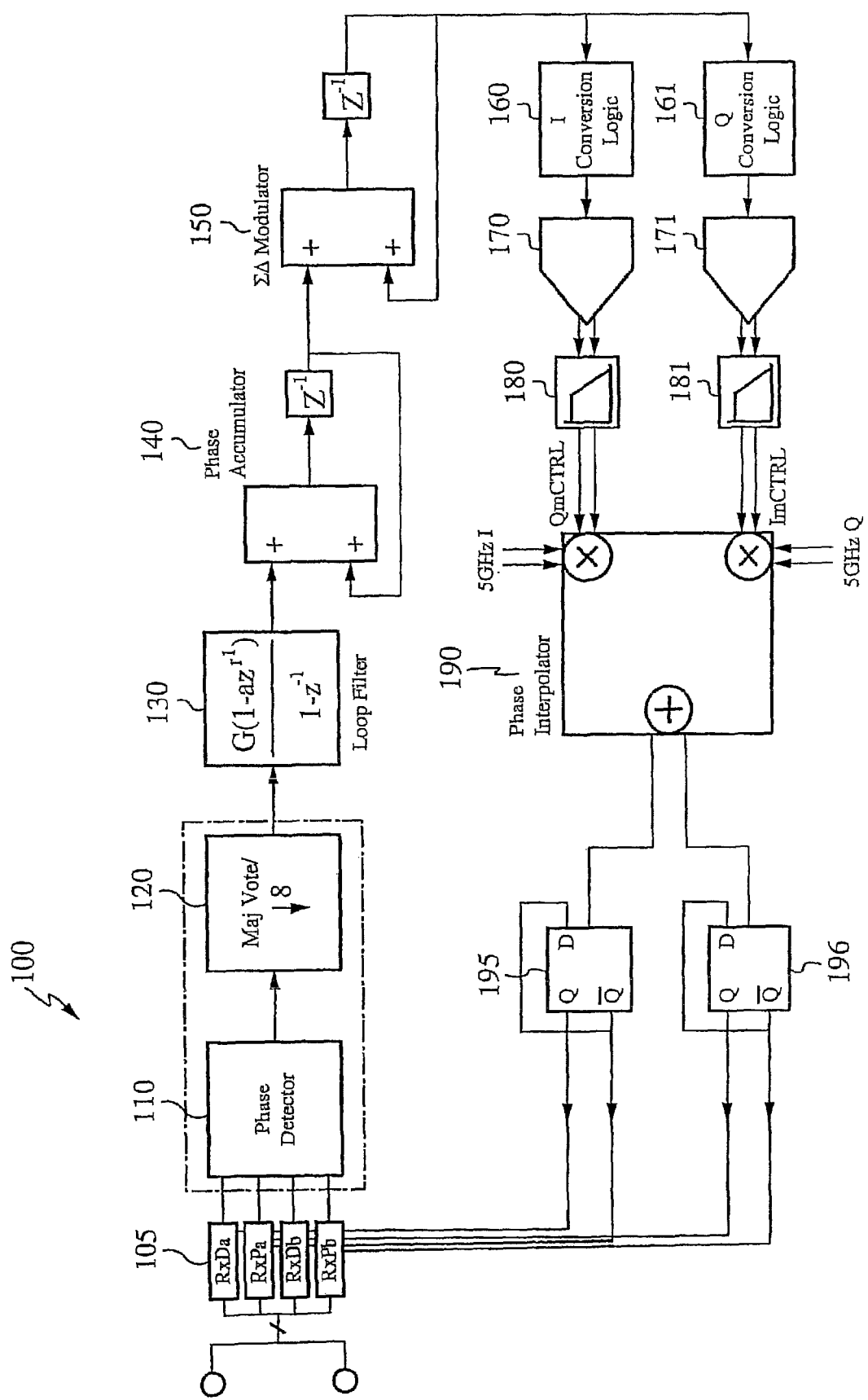
FIG. 2 illustrates a block diagram of a PLL timing recovery unit, in accordance with the present invention.

FIG. 2 illustrates a block diagram of a phase-locked loop (PLL) timing recovery unit 100, in accordance with one embodiment of the present invention. The timing recovery unit 100 comprises a phase detector 110, a majority vote logic 120, a digital loop filter 130, a phase accumulator 140, a sigma delta modulator 150, I- and Q-conversion logic 160 and 161, digital-analog converters 170 and 171, analog reconstruction filters 180 and 181, a phase interpolator 190, and flip flops 195 and 196.

The phase detector 110 is preferably a bang-bang phase detector. The phase detector 110 samples an input waveform at a zero crossing point and at a data point from a receiver 105. Preferably, the receiver 105 and the phase detector 110 use the same circuits. Phase sampling is shifted by 90 degrees to sample the zero crossing of $\{1, -1\}$ and $\{-1, 1\}$ data transitions. Only phase samples of transitions are used. If a phase sample is before the zero crossing point, the phase detector 110 speeds up a clock signal. If the phase sample is after the zero crossing point, the phase detector 110 slows down the lock clock signal. Input samples are processed to indicate the direction to move the loop phase.

The majority vote logic 120 receives a digital signal from the phase detector 110 and performs non-linear processing on the input data and decimates it. Eight "commands" are summed and limited to $\{1, 0, -1\}$ representing an aggregate direction command. Decimation to 625 MHz from 2.5 Ghz permits synthesis of the digital portions of the PLL: the digital loop filter 130, the phase accumulator 140, the sigma delta modulator 150 and the I- and Q-conversion logic 160 and 161.

The loop filter 130 is preferably a programmable first order digital filter. Design is simplified as the input is limited to $\{1, 0, -1\}$ which represents loop phase directions. The loop filter 130 converts a digital word at low frequency to a high precision digital word that describes the required phase at the receiver input. An output of the loop filter 130 is coupled to an input of the phase accumulator 140.

The phase accumulator 140 adds a second pole to ensure the PLL 100 tracks frequency and phase offset. An output of the phase accumulator 140 is preferably an 18-bit high precision digital word that determines a recovery phase of the phase interpolator 190. The phase accumulator 140 is coupled to the sigma delta modulator 150.

The sigma delta modulator 150 receives the high precision digital word and maps it into two transfer functions 160 and 161, an I conversion logic 160 and a Q conversion logic 161, and into at least one digital-analog converter (DAC) 170 and 171 where it is then filtered by at least one analog filter 180 and 181. The combination of the sigma delta modulator 150, the I and Q conversion logic 160 and 161, the DACs 170 and 171 and the analog filters 180 and 181 turn the high precision digital word into a high precision analog value. Phase interpolation is then performed by the phase interpolator 190 to output a clock recovery phase aligned with the incoming data. The phase interpolator 190 is essentially a CMOS four quadrant multiplier. The phase interpolator uses CMU 5 Ghz quadrature clocks to generate a differential 5 Ghz receiver clock. This is then digitally divided to generate two 2.5 Ghz quadrature clocks used by the receiver data and phase receivers.

An inventive feature of the present invention is adoption of a sigma delta modulator that applies dither to a high precision digital word to restore accuracy and granularity lost as a result of the DAC's 170 and 171, which loses most of this precision to fit its available output levels. In one embodiment of the present invention, a dither signal is applied to the digital input signal before placing it in the DAC 170 and 171. The dither signal, which is a frequency shaped signal, possesses a probability density function and is automatically added and spectrally shaped to provide minimum phase jitter. A DC value of the dither signal is shifted and sampled, resulting in multiple outputs. The combined signal—the dither signal applied to the input signal—is then mapped and quantized by the I and Q conversion logic 160 and 161 and the DACs 170 and 171 and filtered by the analog filters 180 and 181. The analog filters 180 and 181 provides a cutoff at a bandwidth of interest which removes out of band quantization noise and signals. In this design, conversion logic will implement the I and Q conversion logic 160 and 161. The analog filters 180 and 181 rebuild a waveform as close to the input analog signal as possible. The output signal of the analog filters 180 and 181 is preferably an interpolated value of the high precision digital word.

Each analog filter 180 and 181 is preferably a low pass filter. The DACs 170 and 171 can be one of a 1-bit DAC, a 2-bit DAC, a 3-bit DAC, a 4-bit DAC, a 5-bit DAC, and a 6-bit DAC. Preferably, the DACs 170 and 171 are 6-bit thermometer DACs. Thermometer DAC element values are preferably scaled to achieve a more sinusoidal transfer function from an output of the modulator 150 to inputs of the phase interpolator 190. Though binary DACs with segmentation can be used, thermometer DACs ensure monotonicity. The phase interpolator 190 receives the output signal of the analog filters 180 and 181 and outputs a clock recovery phase. The clock recovery phase is fed back to the phase detector 110. Thus, a precision filtered analog output controls the phase interpolator 190 to form the recovered clock.

Figure 3:
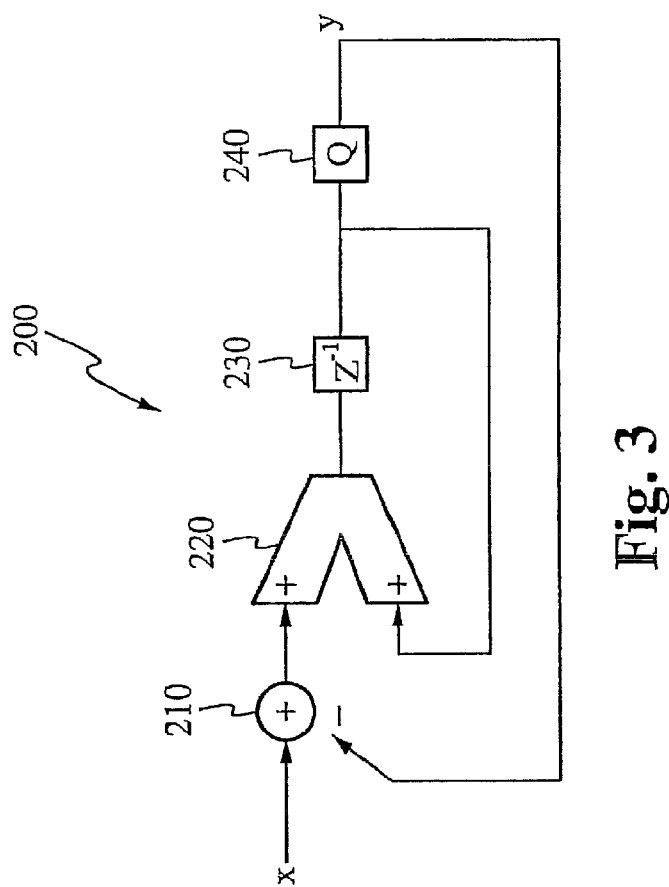
FIG. 3 illustrates a block diagram of a sigma delta modulator, in accordance with the present invention.

FIG. 3 illustrates a block diagram of a sigma delta modulator 200, in accordance with the present invention. The sigma delta modulator 200 includes a twos-complement accumulator 210 for generating a phase accumulator output; a subtractor 215 for subtracting a quantization feedback signal for the phase accumulator output; a two-input multiplexer 220 for combining a subtracted signal and a modulator output feedback signal; an inverter 230 whose output generates the modulator output feedback signal; and a quantizer 240 whose output generates the quantization feedback signal. The sigma delta modulator 200 can be one of a first order, second order, and n-order modulator. The use of a sigma delta modulator and an analog phase interpolator to achieve extremely fine phase step resolution is an inventive feature of the present invention. A 6-bit phase step is hence resolved to ±60 fs; an increase in resolution of more than 50×. The six most significant output bits (MSBs) of the modulator 200 is used to control the DACs 170 and 171. The modulator output feedback and the quantization feedback can be combined into a single feedback comprised of the least significant bits (LSBs) of the accumulator output.

The modulator 200 performs a wrap procedure of the phase accumulator output to prevent saturation or overload condition. The output of the phase accumulator 140 is a twos complement digital representation of the output phase mapping the digital range of $\{1-2^{-(N-1)}, -1\}$ to the phase range of $\{360/2', 360\}$ degrees.

The "overload" condition is prevented by allowing the accumulator to overflow corresponding to a rotation of the phase by $2\pi$. Modulation continues and the dither remains random and uniform across the phase "wrap". When tracking a frequency deviation, the output "wraps" around the phase circle from quadrant IV to quadrant I. The modulator 200 emulates this behavior with appropriate added dither. This "wrap" discontinuity is mapped to a continuous function between all quadrants before analog filtering. In this case, it is mapped to orthogonal functions and other mappings to continuous functions and phase interpolators are possible. The mapping to continuous functions which are then explicitly filtered eliminates jumps at $2\pi$.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

We claim:

1. A method of converting a high precision digital word into a high precision analog signal, the method comprising the steps of:
   a. applying a digital input signal to a dither signal to generate a combined signal for sampling using sigma delta modulation;
   b. mapping the combined signal into an I transfer function and a Q transfer function;
   c. quantizing the combined signal; and
   d. filtering the quantized combined signal to generate an output signal.

2. The method of claim 1 further including the step of sampling the combined signal.

3. The method of claim 1 further including the step of oversampling the combined signal.

4. The method of claim 1 wherein a scalar value of the dither signal is shifted before the dither signal is applied to the digital input signal.

5. The method of claim 1 wherein the output signal is an interpolated value of the digital input signal.

6. The method of claim 1 wherein the digital input signal is generated by a phase accumulator.

7. The method of claim 1 wherein the output signal is an analog signal.

8. The method of claim 1 wherein the quantized combined signal is filtered by an analog reconstruction filter.

9. The method of claim 8 wherein the filtered signal is input to a phase interpolator.

10. The method of claim 9 wherein an output of the phase interpolator is fed back to a phase detector.

11. The method of claim 1 wherein the dither signal is a frequency shaped noise signal.

12. An apparatus for converting a high precision digital word into a high precision analog signal, the apparatus comprising:
  a. a sigma delta modulator for applying a digital input signal to a dither signal to generate a combined signal for sampling;
  b. a digital-to-analog converter for quantizing the combined signal;
  c. an analog filter for filtering the quantized combined signal to generate an output signal; and
  d. a phase interpolator for receiving the output signal and outputting a clock recovery phase.

13. The apparatus of claim 12 wherein the combined signal is sampled.

14. The apparatus of claim 12 wherein the combined signal is oversampled.

15. The apparatus of claim 12 wherein a Scalar value of the dither signal is shifted before the dither signal is applied to the digital input signal.

16. The apparatus of claim 12 wherein the output signal is an interpolated value of the digital input signal.

17. The apparatus of claim 12 wherein the digital input signal is generated by a phase accumulator coupled to the sigma delta modulator.

18. The apparatus of claim 12 further including an I transfer function and a Q transfer function coupled between the sigma delta modulator and the digital-to-analog converter, wherein the combined signal is mapped into the I and Q transfer functions.

19. The apparatus of claim 12 wherein the output signal is an analog signal.

20. The apparatus of claim 12 wherein the analog filter is a low pass reconstruction filter.

21. The apparatus of claim 12 wherein the analog filter provides a cutoff at a bandwidth of interest which removes out of band quantization noise and signals.

22. The apparatus of claim 12 wherein an output of the phase interpolator is fed back to a phase detector.

23. The apparatus of claim 12 wherein the dither signal is a frequency shaped noise signal.

24. A timing recovery unit using sigma delta phase modulation, the timing recovery unit comprising:
  a. a sigma delta modulator for applying a digital input signal to a dither signal to generate a combined signal for sampling;
  b. an I transfer function and a Q transfer function coupled to the modulator for defining a phase interval for interpolation;
  c. a digital-to-analog converter for quantizing the combined signal; and
  d. an analog filter for filtering the quantized combined signal to generate an output signal.

25. The timing recovery unit of claim 24 further comprising a phase interpolator for receiving the output signal and outputting a clock recovery phase, wherein an output of the phase interpolator is fed back to a phase detector.

26. The timing recovery unit of claim 24 wherein the combined signal is sampled.

27. The timing recovery unit of claim 24 wherein the combined signal is oversampled.

28. The timing recovery unit of claim 24 wherein a Scalar value of the dither signal is shifted before the dither signal is applied to the digital input signal.

29. The timing recovery unit of claim 24 wherein the output signal is an interpolated value of the digital input signal.

30. The timing recovery unit of claim 24 wherein the digital input signal is generated by a phase accumulator coupled to the sigma delta modulator.

31. The timing recovery unit of claim 24 wherein the output signal is an analog signal.

32. The timing recovery unit of claim 24 wherein the analog filter is a low pass reconstruction filter.

33. The timing recovery unit of claim 24 wherein the analog filter provides a cutoff at a bandwidth of interest which removes out of band quantization noise and signals.

34. The timing recovery unit of claim 24 wherein the dither signal is a frequency shaped noise signal.

35. A method of converting a high precision digital word into a high precision analog signal, the method comprising the steps of:
  a. applying a digital input signal to a dither signal to generate a combined signal for sampling using sigma delta modulation;
  b. quantizing the combined signal;
  c. filtering the quantized combined signal; and
  d. inputting the filtered signal to a phase interpolator.

36. The method of claim 35 further including the step of sampling the combined signal.

37. The method of claim 35 further including the step of oversampling the combined signal.

38. The method of claim 35 wherein a scalar value of the dither signal is shifted before the dither signal is applied to the digital input signal.

39. The method of claim 35 wherein an output of the phase interpolator is an interpolated value of the digital input signal.

40. The method of claim 35 wherein the digital input signal is generated by a phase accumulator.

41. The method of claim 35 wherein the filtered signal is an analog signal.

42. The method of claim 35 wherein the quantized combined signal is filtered by an analog reconstruction filter.

43. The method of claim 35 wherein an output of the phase interpolator is fed back to a phase detector.

44. The method of claim 35 wherein the dither signal is a frequency shaped noise signal.

* * * * *